United States Patent
Varghese et al.

(10) Patent No.: US 11,114,382 B2
(45) Date of Patent: Sep. 7, 2021

(54) MIDDLE-OF-LINE INTERCONNECT HAVING LOW METAL-TO-METAL INTERFACE RESISTANCE

(71) Applicant: International Business Machines Corporation, Armonk, NY (US)

(72) Inventors: Alex Joseph Varghese, Albany, NY (US); Richard A. Conti, Katonach, NY (US); Su Chen Fan, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 16/164,940

(22) Filed: Oct. 19, 2018

(65) Prior Publication Data

US 2020/0126926 A1    Apr. 23, 2020

(51) Int. Cl.
| | |
|---|---|
| *H01L 21/768* | (2006.01) |
| *H01L 21/285* | (2006.01) |
| *H01L 21/311* | (2006.01) |
| *H01L 23/532* | (2006.01) |

(52) U.S. Cl.
CPC .... *H01L 23/53238* (2013.01); *H01L 21/2855* (2013.01); *H01L 21/31116* (2013.01); *H01L 21/76802* (2013.01); *H01L 21/76846* (2013.01); *H01L 21/76847* (2013.01); *H01L 21/76877* (2013.01)

(58) Field of Classification Search
CPC ......... H01L 23/53238; H01L 21/76846; H01L 21/31116; H01L 21/76877; H01L 21/2855; H01L 21/76847; H01L 21/76802
See application file for complete search history.

(56) References Cited

U.S. PATENT DOCUMENTS

| | | | |
|---|---|---|---|
| 5,933,773 A | 8/1999 | Simon et al. | |
| 6,391,785 B1 | 5/2002 | Satta et al. | |
| 6,444,567 B1 * | 9/2002 | Besser | H01L 21/76849 |
| | | | 257/E21.591 |
| 6,607,977 B1 | 8/2003 | Rozbicki et al. | |
| 6,939,801 B2 | 9/2005 | Chung et al. | |
| 6,943,111 B2 | 9/2005 | Lin et al. | |
| 7,694,413 B2 | 4/2010 | Johnston et al. | |
| 8,252,680 B2 | 8/2012 | Lavoie | |

(Continued)

OTHER PUBLICATIONS

Li et al.,"Barrier-free direct-contact-via (DCV) structures for copper interconnects", Electronics Letters, 38(18), pp. 1026-1028 (2002).

(Continued)

*Primary Examiner* — David Vu
(74) *Attorney, Agent, or Firm* — Cantor Colburn LLP; Erik Johnson

(57) ABSTRACT

Provided are embodiments for an MOL interconnect structure having low metal-to-metal interface resistance interconnect structure including one or more contacts of one or more devices formed on a substrate. A dielectric layer is formed on one or more devices. One or more trenches are formed in the dielectric layer. The MOL interconnect structure also includes a barrier layer formed on one or more portions of the dielectric layer, along with a metallization layer, wherein the metallization layer forms a metal-to-metal interface with the one or more contacts.

10 Claims, 13 Drawing Sheets

(56) References Cited

U.S. PATENT DOCUMENTS

| | | | |
|---|---|---|---|
| 8,361,900 B2 | 1/2013 | Pan et al. | |
| 8,614,107 B2 | 12/2013 | Lavoie et al. | |
| 9,837,309 B2 | 12/2017 | Clevenger et al. | |
| 2003/0068894 A1 | 4/2003 | Iggulden et al. | |
| 2004/0127014 A1* | 7/2004 | Huang | H01L 21/76843 |
| | | | 438/627 |
| 2009/0166867 A1 | 7/2009 | Simka et al. | |
| 2009/0321938 A1 | 12/2009 | Cunningham | |
| 2011/0233778 A1 | 9/2011 | Lee et al. | |
| 2014/0077379 A1* | 3/2014 | Dirk | H01L 23/53295 |
| | | | 257/762 |
| 2016/0163645 A1 | 6/2016 | Kamineni et al. | |
| 2017/0005037 A1 | 1/2017 | Liang et al. | |
| 2018/0096890 A1 | 4/2018 | Clevenger et al. | |

OTHER PUBLICATIONS

Reznicek et al., "High Performance MOL interconnects", IBM Disclosure YOR8-2015-1389, Jul. 20, 2015, 12 pages.

Slew et al., "CVD Mn-based self-formed barrier for advanced interconnect technology." Proc. IEEE IITC 2013 conference, pp. 1-3 (2013).

Usui et al., "Highly Reliable Copper Dual-Damascene Interconnects With Self-Formed MnSixOy Barrier Layer", IEEE Trans. Electron Devices, vol. 53 #10, pp. 2492-2499, (2006.

Wu et al., "Advanced Metal barrier free Cu damascene interconnects with PECVD silicon carbide barriers for 90/65-nm BEOL technology", Proc. IEEE IEDM'02. pp. 595-598 (2002).

\* cited by examiner

MIDDLE-OF-LINE INTERCONNECT HAVING LOW METAL-TO-METAL INTERFACE RESISTANCE

BACKGROUND

The present invention generally relates to integrated circuits, and more specifically, to middle-of-line (MOL) interconnects having low metal-to-metal interface resistance.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL portion. Layers of interconnections are formed above these logical and functional layers during the BEOL stage to complete the IC.

SUMMARY

Embodiments of the present invention are directed to a method for fabricating MOL interconnects having low metal-to-metal interface resistance. A method of fabricating an interconnect structure, the method includes forming a dielectric layer over one or more contacts of one or more devices; forming a trench in the dielectric layer over one or more contacts; depositing a barrier layer on the dielectric layer, the trench, and the one or more contacts; forming a cap layer on one or more portions of the barrier layer; removing one or more portions of the barrier layer; removing the cap layer; and depositing a metal interconnect layer on the one or more contacts to form a metal-to-metal interface between the metal interconnect layer and the one or more contacts.

Embodiments of the present invention are directed to an MOL interconnect structure having low metal-to-metal interface resistance. A non-limiting example of the interconnect structure includes one or more contacts of one or more devices formed on a substrate; a dielectric layer formed on one or more devices; one or more trenches formed in the dielectric layer; a barrier layer formed on one or more portions of the dielectric layer; and a metallization layer, wherein the metallization layer forms a metal-to-metal interface with the one or more contacts.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3-9 depict cross-sectional views of an embodiment of an interconnect structure after various processing operations according to one or more embodiments of the invention, in which:

FIG. 3 is a cross-sectional view of a semiconductor structure after initial fabrication operations according to one or more embodiments of the invention;

FIG. 4 is a cross-sectional view of a structure after fabrication operations according to one or more embodiments of the invention;

FIG. 5 is a cross-sectional view of a structure after fabrication operations according to one or more embodiments of the invention;

FIG. 6 is a cross-sectional view of a structure after fabrication operations according to one or more embodiments of the invention;

FIG. 7 is a cross-sectional view of a structure after fabrication operations according to one or more embodiments of the invention;

FIG. 8 is a cross-sectional view of a structure after fabrication operations according to one or more embodiments of the invention; and FIG. 9 is a cross-sectional view of a structure after fabrication operations according to one or more embodiments of the invention;

FIGS. 10-12 depict cross-sectional views of an embodiment of an interconnect structure after various processing operations according to one or more embodiments of the invention, in which:

FIG. 10 is a cross-sectional view of a structure after fabrication operations according to one or more embodiments of the invention;

FIG. 11 is a cross-sectional view of a structure after fabrication operations according to one or more embodiments of the invention;

FIG. 12 is a cross-sectional view of a structure after fabrication operations according to one or more embodiments of the invention.

Figure 1:
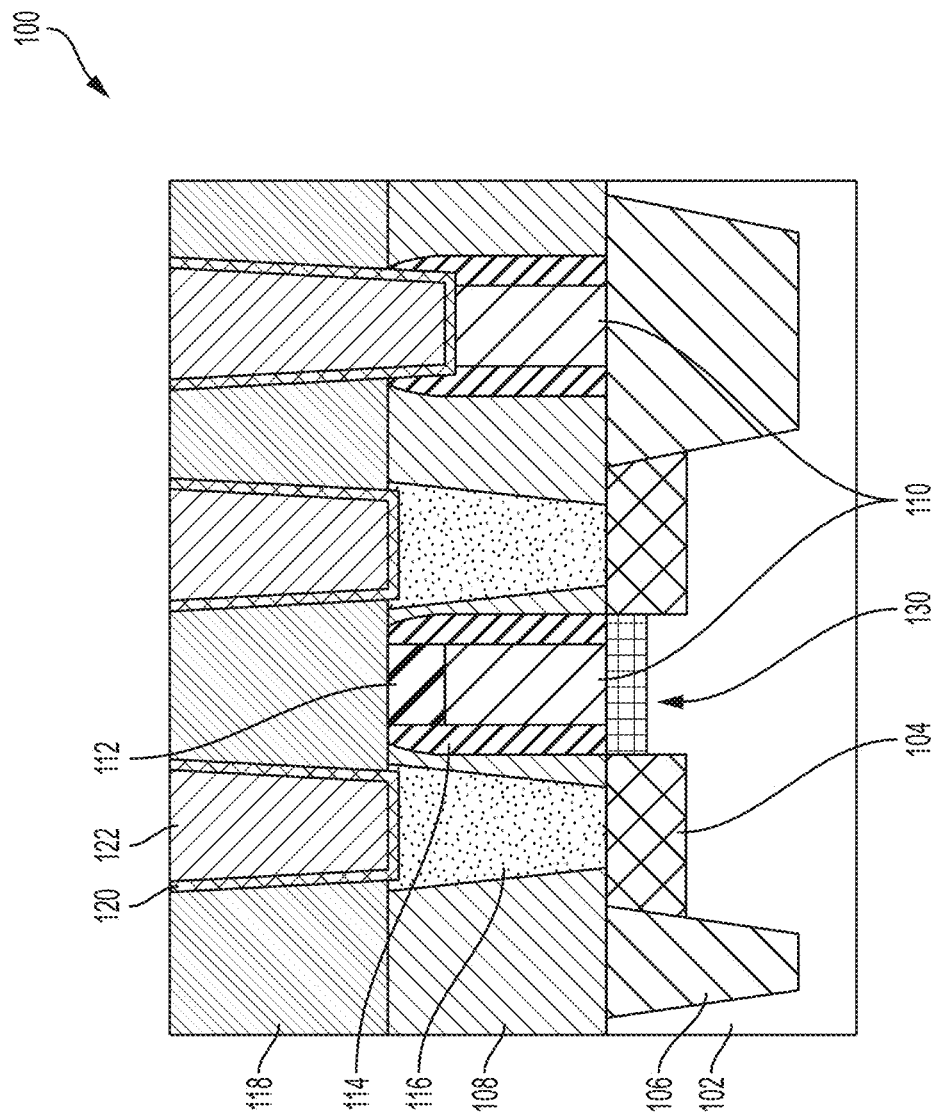
FIG. 1 depicts a portion of a semiconductor wafer having MOL interconnects formed therein in accordance with the prior art.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSTFETs is known as a planar device geometry in which the various parts of the MOSFET device are laid down as planes or layers.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

A FET is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A fin field effect transistor (finFET) is a semiconductor device that positions the channel region of the semiconductor device in a fin structure.

Semiconductor devices can exhibit delays caused by the cumulative resistance of the various portions of the interconnect stack (interconnect metals, contacts, liners, etc.) which can hinder the performance of the device. The resistivity is directly impacted by the structure of the devices.

In FIG. 1, a structure 100 as shown includes a substrate 102 having S/D regions 104 and the shallow trench isolation (STI) 106. Also, a channel region 130 has been formed under the gate 110 between the S/D regions 104. As shown in FIG. 1, an inter-layer dielectric (ILD) 108 has been formed on the substrate 102. In addition, a gate 110 has been formed on the substrate 102 where the gate 110 includes a gate cap 112 and sidewall spacers 114. The contacts 116 have been formed in the ILD 108 that are coupled to the S/D regions 104. The structure 100 also includes a dielectric layer 118 that has been formed on the ILD 108. The dielectric layer 118 includes trenches or vias that have liner/barrier layers 120 contacting the sidewalls of the dielectric layer 118 and portions of the contacts 116. A metal layer 122 has been deposited in the trench on top of the barrier layer 120 and has been planarized.

The vertical resistivity calculation of the structures between the metal layer 122 down to the S/D regions 104 includes several components that contribute to the resistivity as discussed with reference to FIG. 2.

Figure 2:
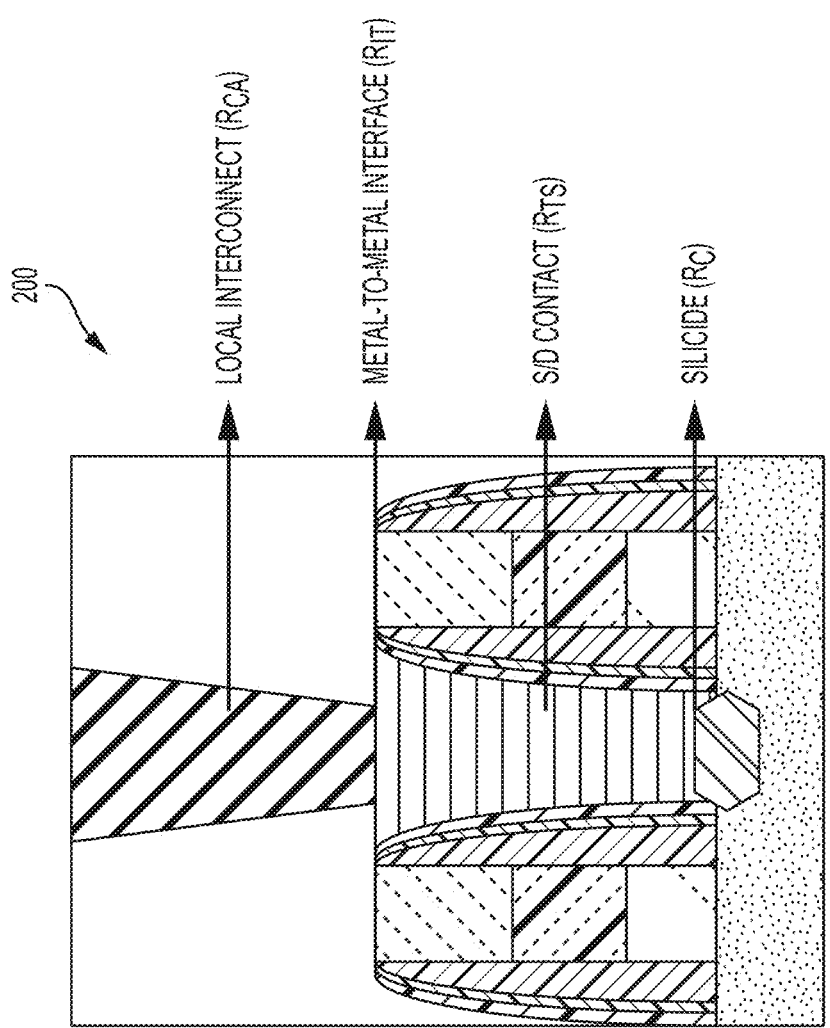
FIG. 2 depicts a cross-sectional view of an interconnect layer and semiconductor device in accordance with one or more embodiments of the invention.

In FIG. 2, a cross-sectional view of a structure 200 of an interconnect structure according to one or more embodiments of the invention in accordance with one or more embodiments is shown. The vertical resistivity of the structure 200 can be approximated as follows:

$$R_{MOL} = R_{CA} + R_{IT} + R_{TS} + R_C \quad \text{(Eq. 1)}$$

wherein $R_{MOL}$ is the total MOL resistivity; $R_{CA}$ is the local interconnect resistivity; $R_{IT}$ is the metal-to-metal interface resistivity; $R_{TS}$ is the S/D contact resistivity; and $R_C$ is the Silicide resistivity. The total resistivity is the aggregate of each of the components. As shown in FIG. 2, there is no barrier layer between the local interconnect and the S/D contact which reduces the overall resistivity.

Referring back to FIG. 1, the resistivity calculation for the structure 100 includes an additional component which is the resistivity contributed by the barrier layer 120 that lies between the metal layer 122 and the contact 116. In some configurations, this resistivity component is the largest contributing factor in the total resistivity calculation. By removing this barrier layer 120 between the metal layer 122 and the contact 116, the overall vertical resistivity can be reduced and the performance of the device increased.

Conventionally the barrier layer 120 is required to prevent the metal of the interconnect layer from diffusing into the contact layer resulting in a semiconductor device having undesirable characteristics. However, while providing protection, the barrier layer increases the vertical resistivity of the device.

Turning now to an overview of the aspects of the invention, one or more embodiments of the invention address the above-described shortcomings of the prior art by providing an interconnect structure that does not require the barrier layer between a metal electrode and S/D contact to reduce the overall vertical resistivity of the device.

The above-described aspects of the invention address the shortcomings of the prior art by providing a method and structure that does not require a barrier layer between the interconnect layer and contact of the semiconductor device, which reduces the vertical resistivity of the device. The performance delay caused by the resistivity using the techniques described herein is reduced which increases the overall performance of the device.

In some embodiments of the invention, the methods and structures described herein provide a finFET semiconductor device that can be formed on a bulk semiconductor substrate, in which the source and drain region portions of the fin structure have a high dopant concentration of n-type or p-type dopants, a uniform dopant concentration of n-type or p-type dopants, as well as an abrupt junction with the channel region of the fin structure. In some embodiments of the invention, the high and uniform concentration of n-type or p-type dopants that is present in the source and drain regions results from the source and drain regions being formed using a process that employs in situ doping. By "in-situ" it is meant that the dopant that dictates the conductivity type, i.e., n-type or p-type, of the source and drain regions is introduced during the process step that forms the source and drain regions. For example, the dopant that dictates the conductivity type of the source and drain regions can be introduced during the epitaxial deposition process that forms the material layer for the source and drain regions, wherein as each layer of the material is deposited an substantially equal amount of dopant is introduced to each layer of the material being deposited so that the concentration of dopant in the deposited material is uniform throughout the deposited materials thickness. This is distinguishable from introducing the dopant that dictates the conductivity type of a material after it is formed using ion implantation. Dopant that is introduced by ion implantation typically has a high concentration region, which is the target depth for the dopant being implanted, with a tail of decreasing dopant extending from the high concentration region. Further, dopant introduced by ion implantation damages the lattice structure of the material being implanted, which introduces defects to the material being implanted. In some embodiments of the invention, the source and drain regions of the fin structures produced by methods in accordance with aspects of the invention have a low defect density, which at least in part results from their formation using epitaxial deposition and in situ doping. In some embodiments of the invention, the methods and structures that are described herein initially provide optimized source and drain region doping across the entire fin structure, and then provides a replacement channel region to provide the correct channel doping for the semiconductor device, e.g., finFET. The methods and structures described herein provide a fin structure including uniform doping of n-type or p-type dopants in the source and drain region portions of the fin structure, and a lower dopant concentration of n-type or p-type dopants in the source and drain region portions of the fin structure than the dopant concentration of n-type or p-type dopants in the epitaxial merge structures that are formed on the source and drain region portions of the fin structures.

Figure 3:
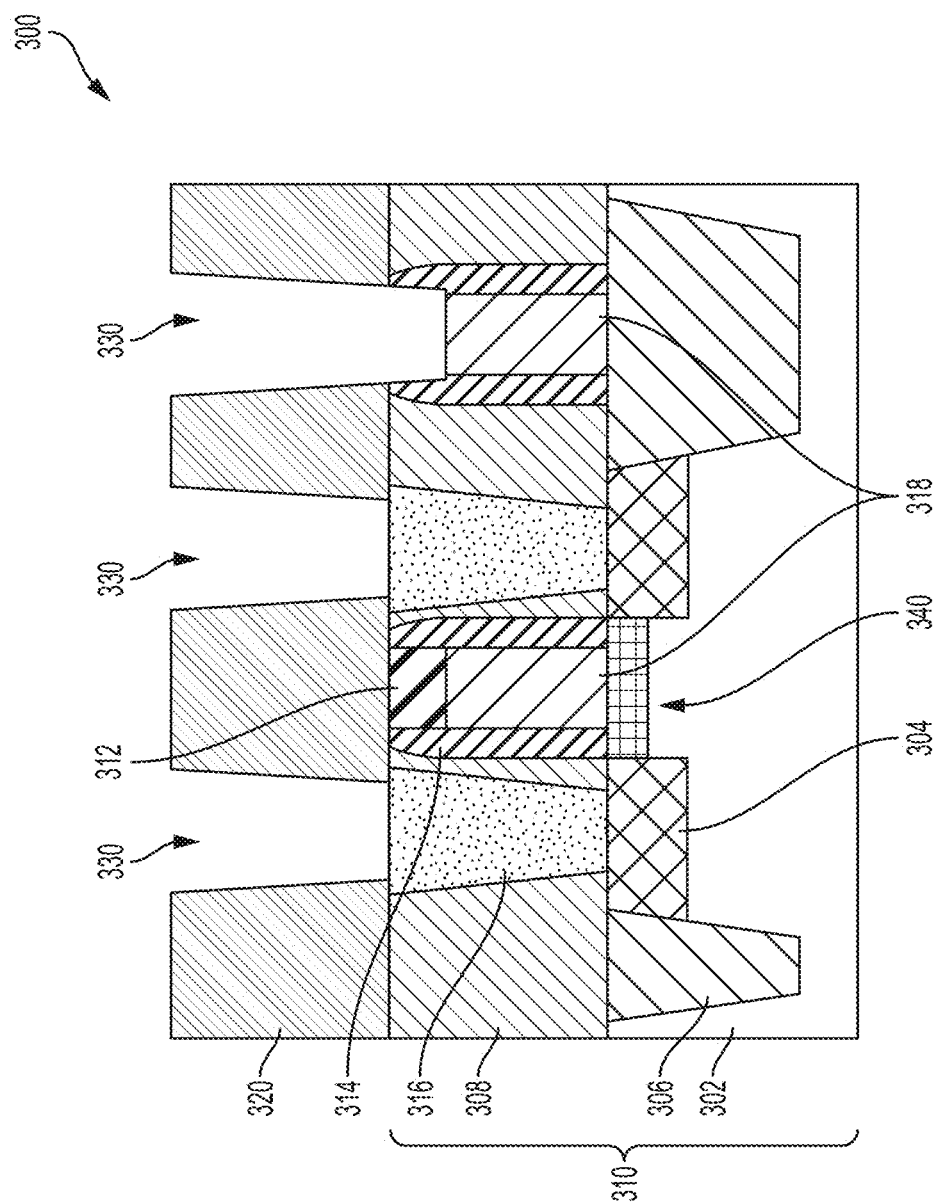

Turning now to a more detailed description of aspects of the present invention, FIGS. 3-12 depict cross-sectional views of the structure 300 of an interconnect in accordance with one or more embodiments of the invention. The structure 300 includes a semiconductor device 310 formed on a substrate 302. The structure 300 as shown includes S/D regions 304 and the shallow trench isolation (STI) 306. As shown in FIG. 3 a channel region 340 (such as in a planer CMOS FET) has been formed between the S/D regions 304. It should be understood the channel region 340 can also be formed in the fin of a finFET device. As shown in FIG. 3, the IDL 308 has been formed on the substrate 302. In addition, a gate 318 has been formed on the substrate 302 where the gate 318 includes a gate cap 312 and sidewall spacers 314. In some embodiments of the invention, the gate cap 312 can be etched away by contact RIE which is also shown in FIG. 3. The contacts 316 have been formed in the IDL 308 that are coupled to the S/D regions 304. The structure 300 also includes a dielectric layer 320 that has been formed on the IDL 108. The dielectric layer 320 includes trenches that have barrier layers 120 contacting the sidewalls of the dielectric layer 320 and portions of the contacts 316.

In this non-limiting example, a gate 318 has been formed on the substrate 304. It is to be understood that the underlying semiconductor device 310, in this case, a finFET, can be any type of semiconductor device having contacts connecting to an interconnect, such as a VFET or other type of device.

FIG. 3 depicts a cross-sectional view of the structure 300 after forming a dielectric layer 320 during an intermediate operation of the method of fabricating an interconnect according to one or more embodiments of the invention. In one or more embodiments the dielectric layer is made of Si or SiO2. As shown in FIG. 3, a plurality of trenches 330 has been formed in the dielectric layer 320 exposing a portion of the contact 316 and the sidewalls of the dielectric layer 320. In one or more embodiments of the invention, the plurality of trenches 330 has been formed by an RIE process.

Figure 4:
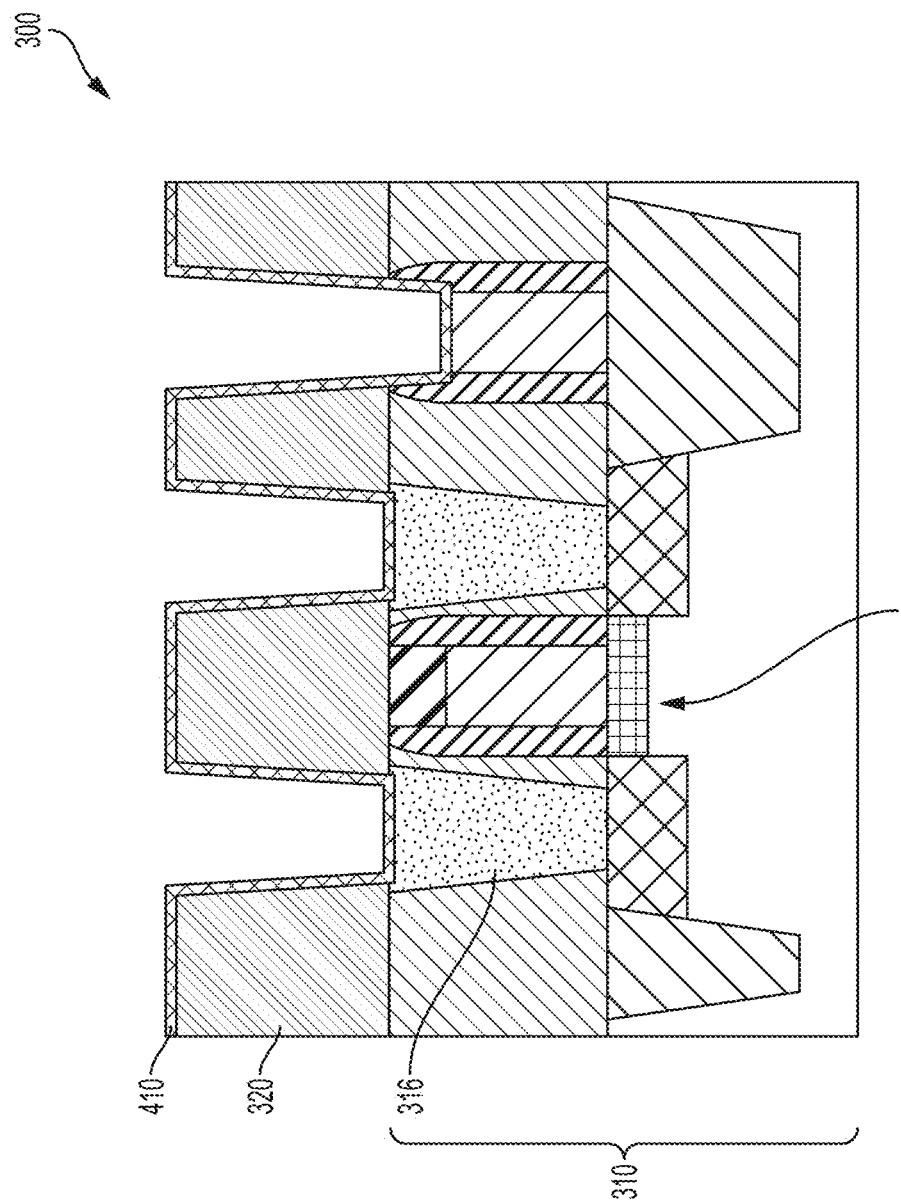

FIG. 4 depicts a cross-sectional view of the structure 300 after forming a barrier layer 410 during an intermediate operation of the method of fabricating an interconnect structure according to one or more embodiments of the invention. As shown in FIG. 4, a barrier layer 410 has been deposited on portions of the dielectric layer 320 such as a top portion and sidewalls of the dielectric layer 320, and also has been deposited on portions of the exposed contacts 316. In one or more embodiments of the invention, the barrier layer 410 is used to prevent other layers and materials of the structure 300 from attacking the dielectric layer 320 during the metal deposition. The barrier layer 410 can include such materials as TiN, WCx, or MO-W. In one or more embodiments of the invention, the barrier layer 410 is a conformal barrier layer. In one or more embodiments of the invention, if cobalt is used TiN can be used as a diffusion barrier layer and an adhesion layer (dielectric layer 320) is SiN.

Figure 5:
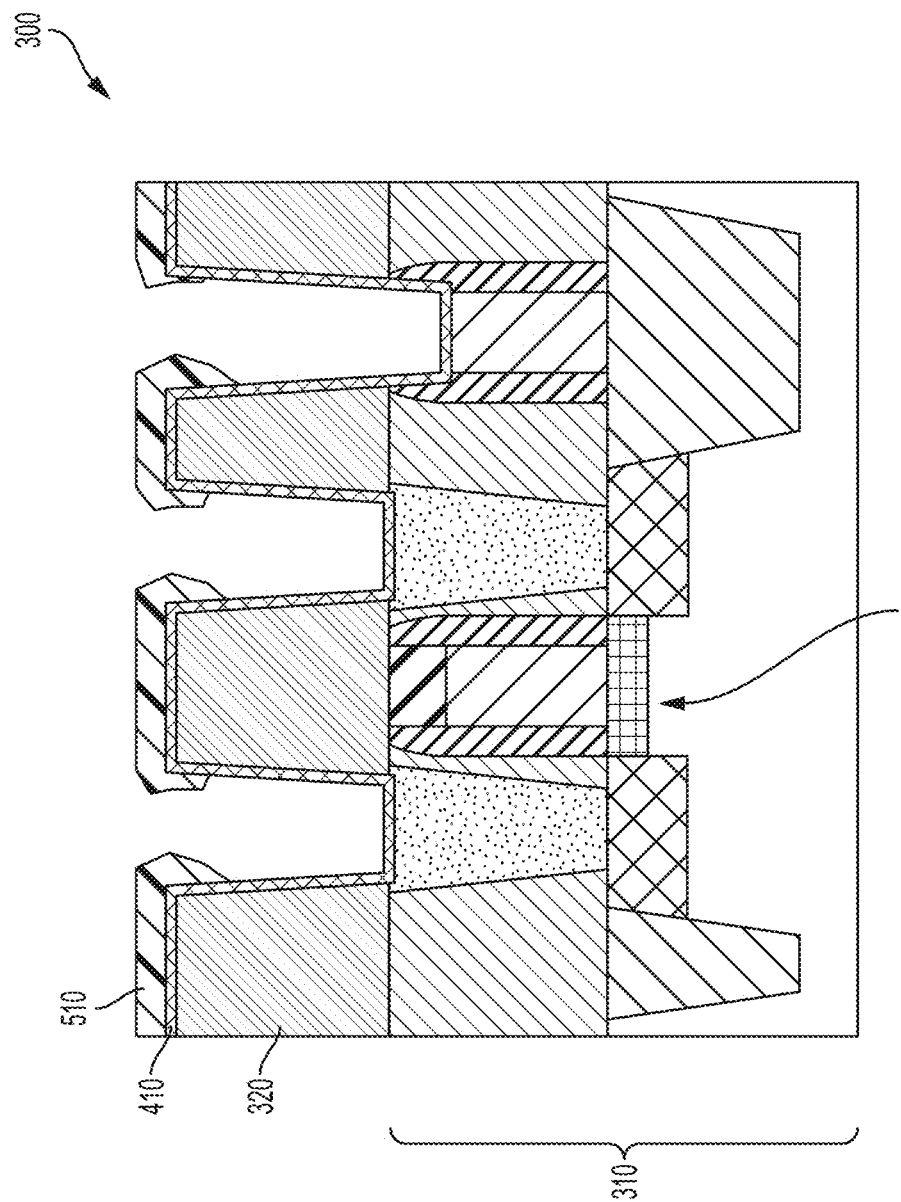

FIG. 5 depicts a cross-sectional view of the structure 300 after forming a spacer cap 510 during an intermediate operation of the method of fabricating an interconnect structure according to one or more embodiments of the invention. As shown in FIG. 5, a spacer cap layer 510 has been formed on portions of the barrier layer 410. In one or more embodiments of the invention, the spacer cap 510 is formed by an impulse PVD deposition process which forms the spacer cap 510 on the top portions of the trench or on top of wide structures. In some embodiments of the invention, the trenches 330 are spaced apart by a 10-30 nm. If the trenches 330 are too wide, the Si deposition of the impulse PVD deposition will not only be deposited on top but will also be deposited inside the trenches 330.

Figure 6:
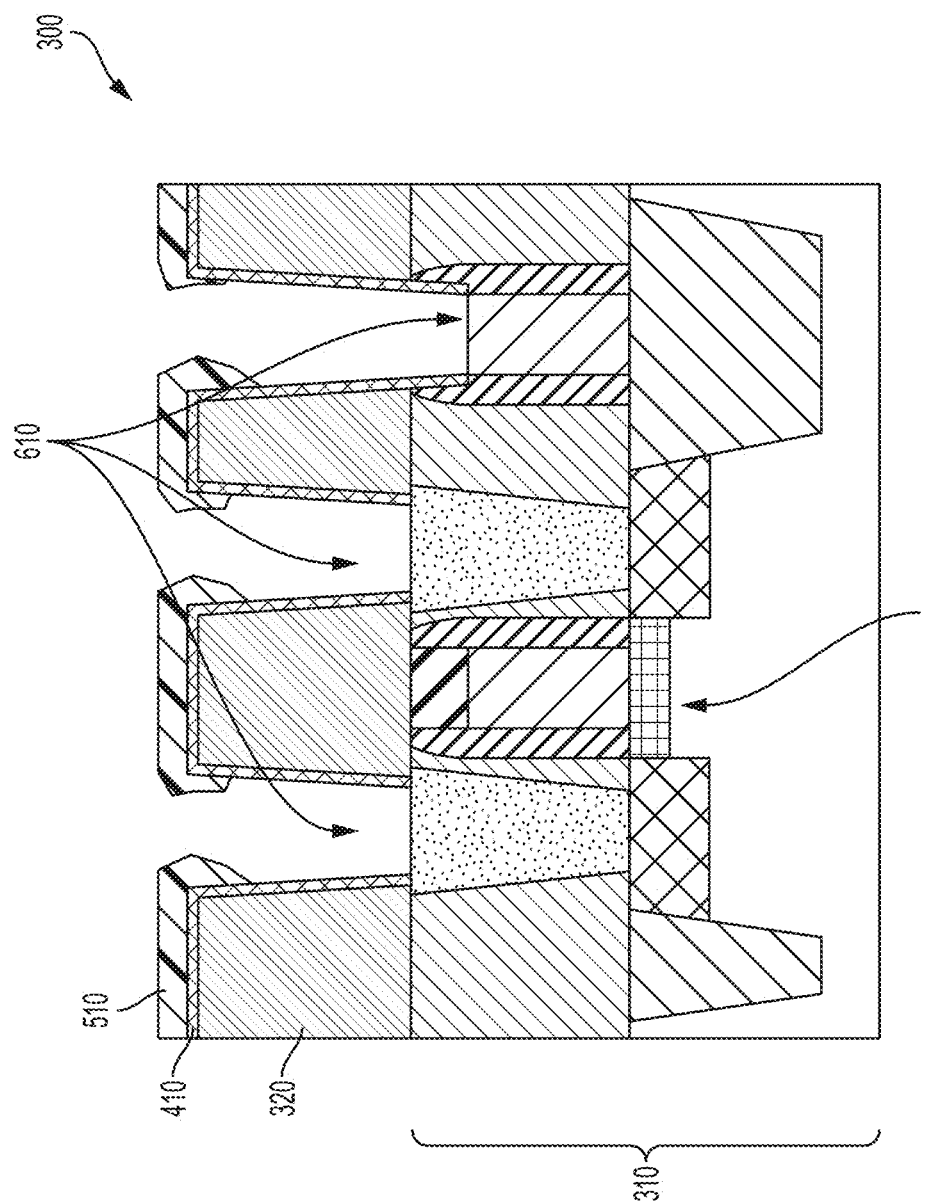

FIG. 6 depicts a cross-sectional view of the structure 300 after removing portions of the barrier layer 410 during an intermediate operation of the method of fabricating an interconnect according to one or more embodiments of the invention. In one or more embodiments of the invention, a directional RIE process is used to remove portions of the barrier layer 410 to expose the top portions 610 of the contact to form metal-to-metal interface shown in FIG. 9. The directional RIE process does not remove the portions of the barrier layer 410 along the sidewalls of the dielectric layer 320.

Figure 7:
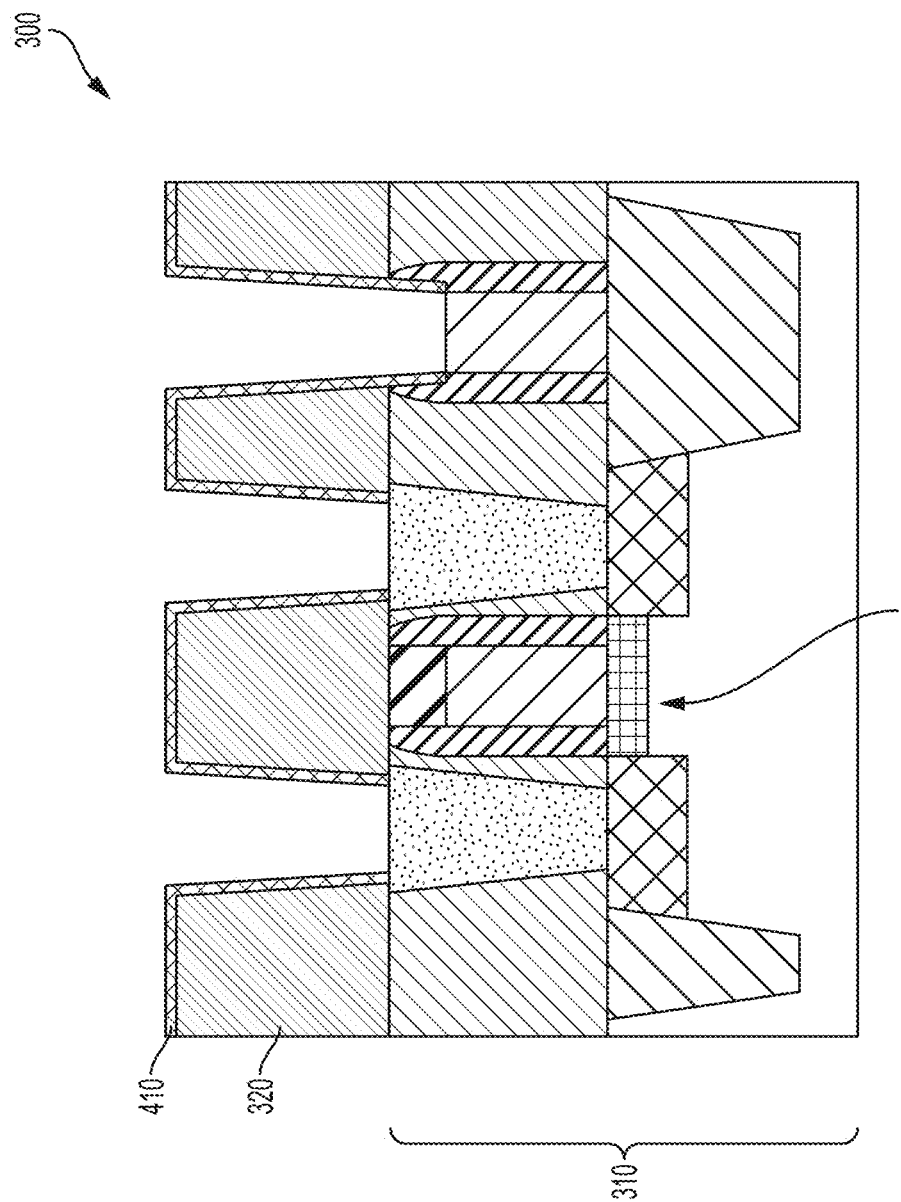

FIG. 7 depicts a cross-sectional view of the structure 300 after removing the cap layer 510 during an intermediate operation of the method of fabricating an interconnect according to one or more embodiments of the invention. In one or more embodiments of the invention, the spacer cap 510 is removed by performing a selective etch process. It is to be understood that other types of etching processes can be used. As a resulting of the selective etching process, portions of the barrier layer 410 remain along the sidewalls of the dielectric layer 320.

Figure 8:
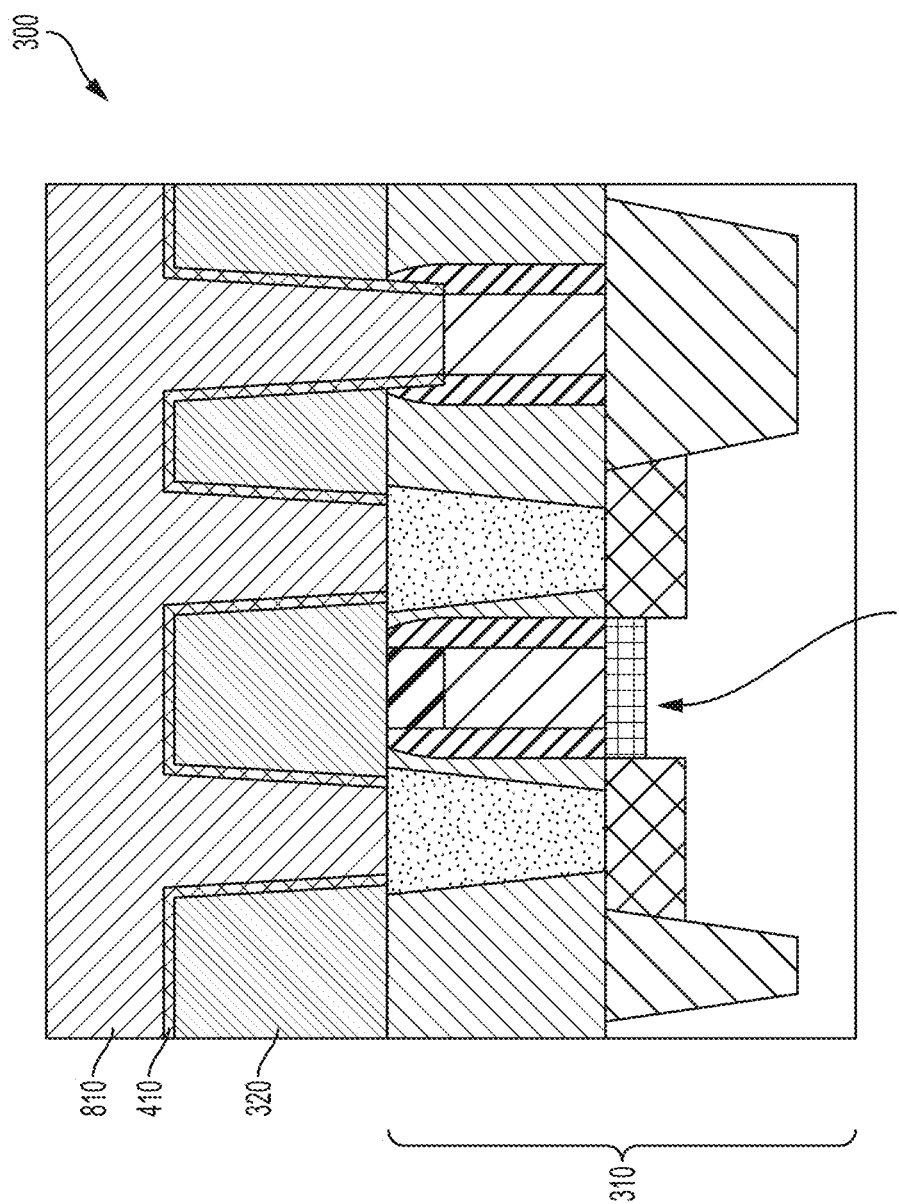

FIG. 8 depicts a cross-sectional view of the structure 300 after forming metal layer 810 during an intermediate operation of the method of fabricating an interconnect according to one or more embodiments of the invention. As shown in FIG. 8, the bulk metal layer 810 has been deposited on the structure 300 to fill the trenches 330. As shown, the metal-to-metal interface is formed between the metal layer 810 and contacts 316. In addition, the barrier layer 410 is only at the metal/dielectric interface. The metal layer 810 can be formed of various metals including but not limited to tungsten (W), cobalt (Co), copper (Cu), or ruthenium (Ru).

Figure 9:
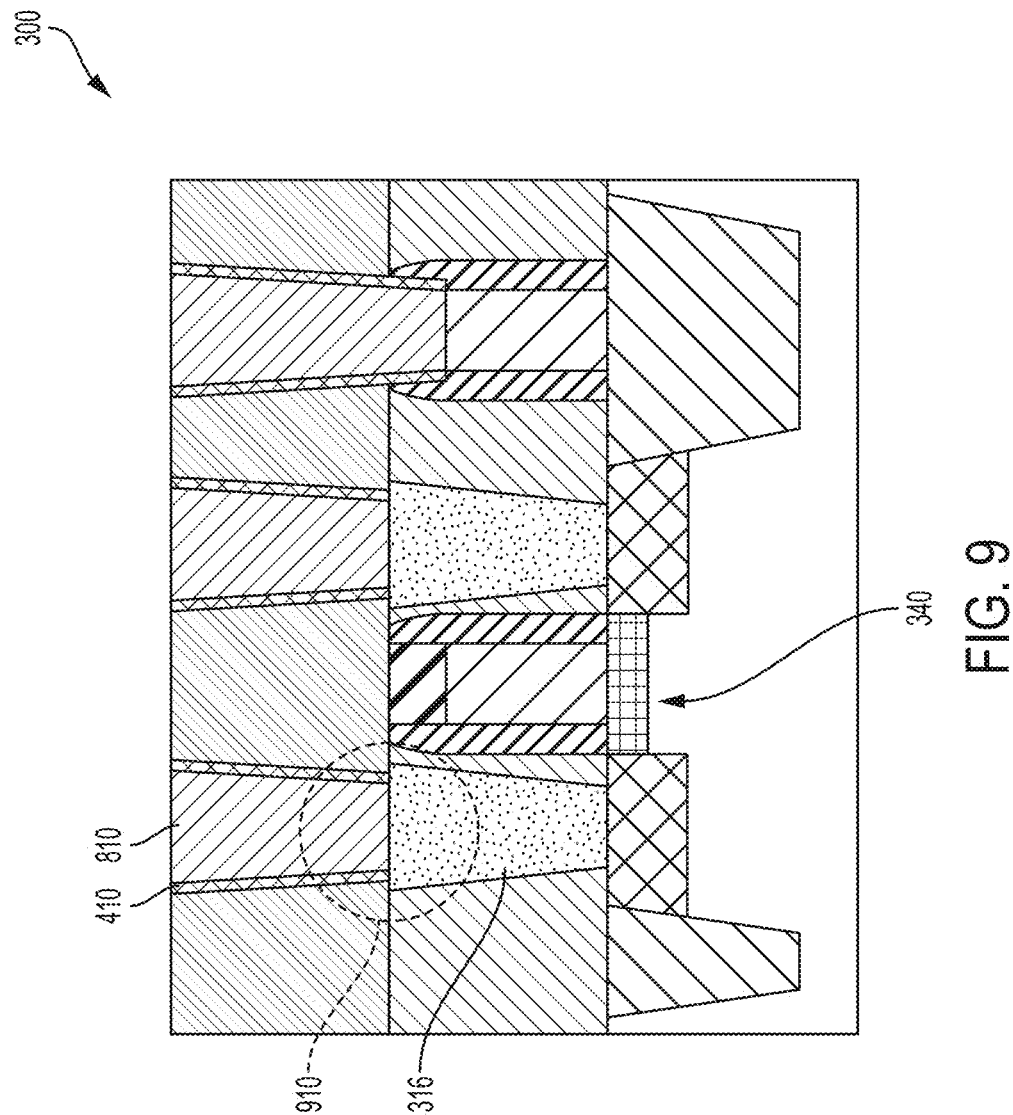

FIG. 9 depicts a cross-sectional view of the structure 300 after performing a planarization operation of the method of fabricating an interconnect according to one or more embodiments of the invention. As shown in FIG. 9, the planarization process has been performed to remove portions of the metal layer 810 and portions of the barrier layer 410 on the top surface of the dielectric layer 320. As shown in FIG. 9, a metal-to-metal interface 910 (vertical interface) has been formed between the metal layer 910 and the contact 316 which reduces the overall vertical resistivity of the structure 300.

Figure 10:
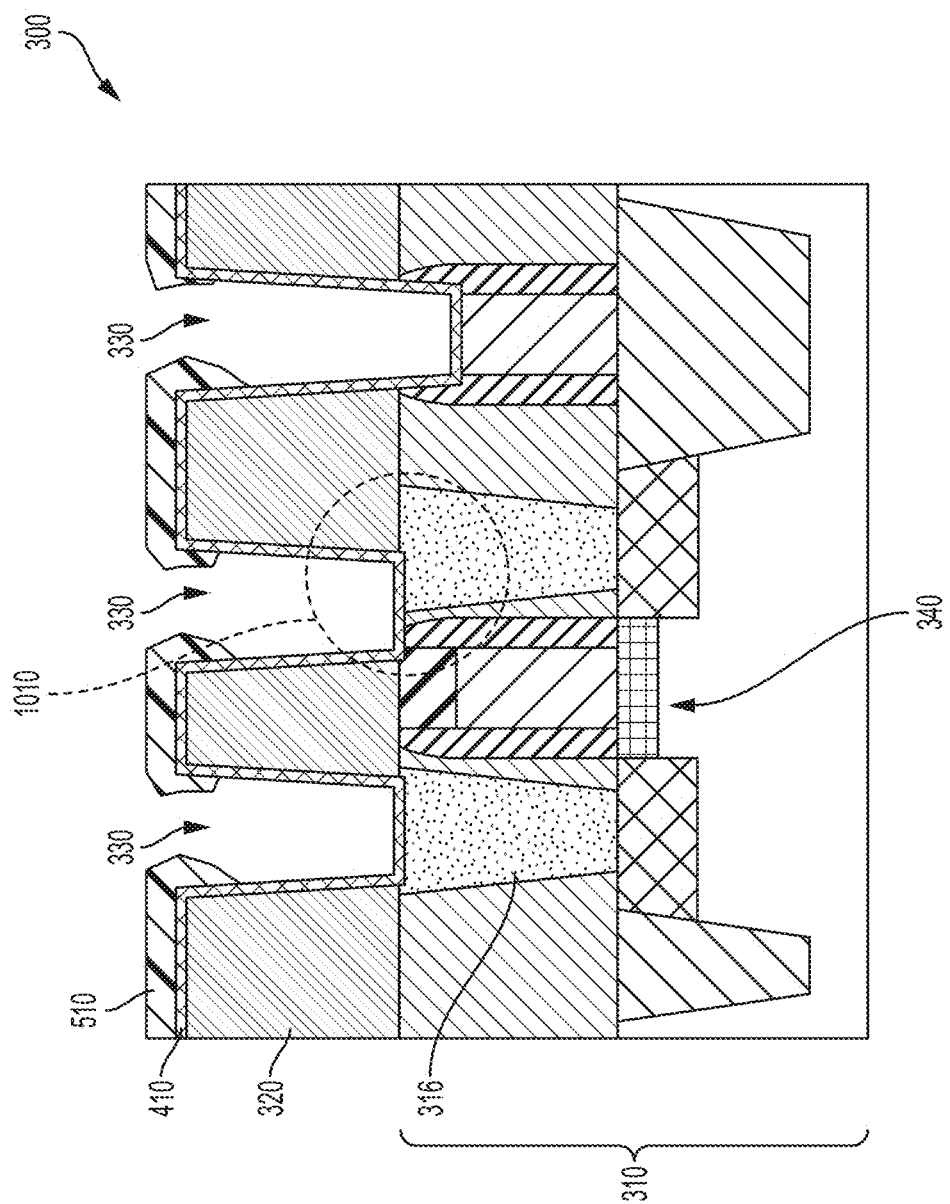

FIG. 10 illustrates the misalignment of a trench 330 for the metal interconnect and the contact 316 which will lead to a less than optimal connection between the metal interconnect and the contact 316. In FIG. 10, the trench 330 partially overlaps the cap of the fin device. In the event a misalignment occurs, the techniques described herein provide a higher tolerance to misaligned metal layers and contacts 316 due to its lower resistivity. In the case of misalignment, 4-8 nm of overlap is required between the interconnect and the contact. Using prior art methods that include the barrier layer 410 between the metal layer and the contact 316, it is clear the barrier layer will dominate the overlap area, therefore, a larger amount of overlap is required. The techniques described herein remove the barrier layer and allow a smaller amount of overlap between the electrode and S/D contact to maintain operability of the device.

Figure 11:
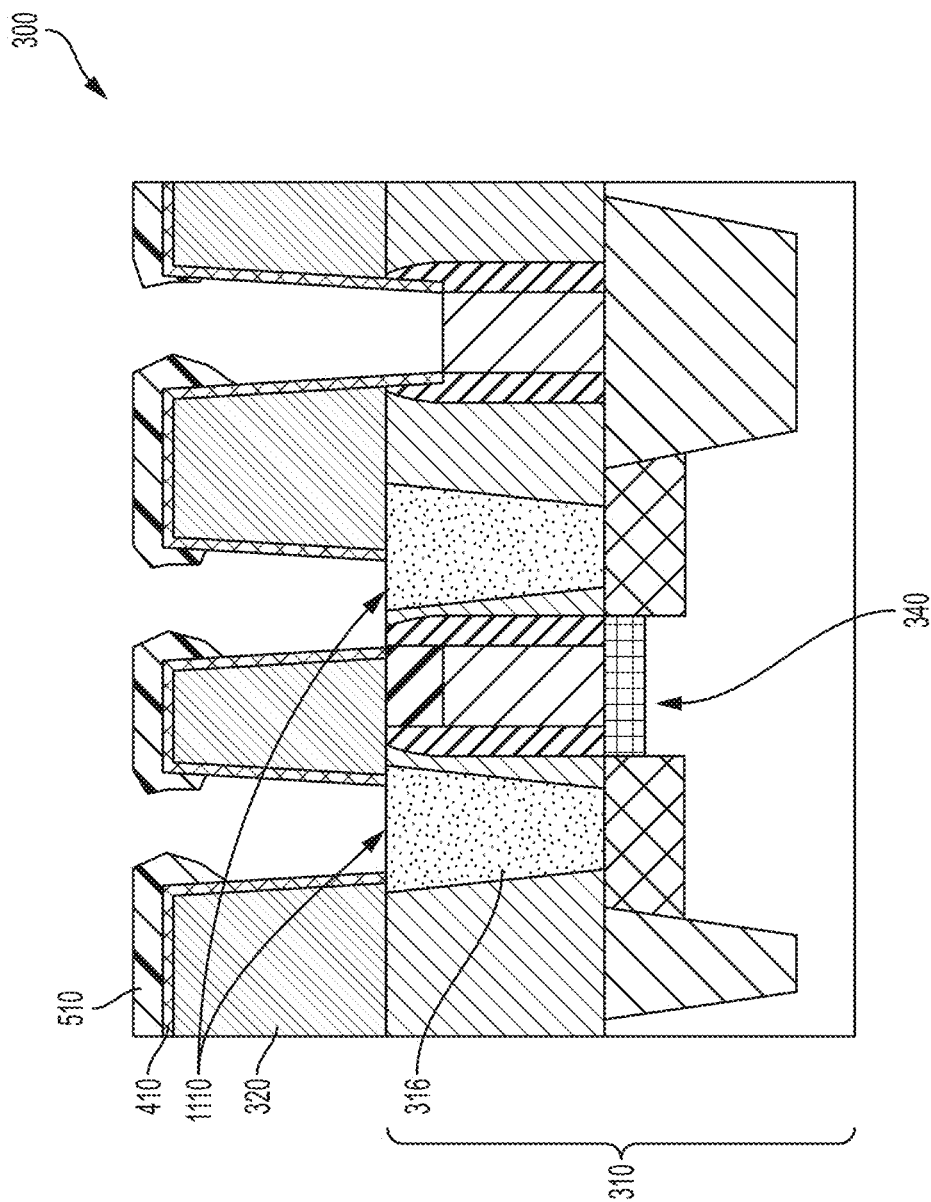

FIG. 11 depicts a cross-sectional view of the structure 300 after removing portions of the barrier layer during an intermediate operation of the method of fabricating an interconnect structure according to one or more embodiments of the invention. In FIG. 11 (similar to FIG. 5), portions 1110 of the barrier layer 410 over the contacts 316 have been removed to form the low resistivity metal-to-metal interface. Because the resistivity is substantially reduced the device remains operable compared to a configuration with the barrier layer 410 between the metal layer and the contact 316. The barrier layer increases the RC delay of the device which impairs the device's operability.

Figure 12:
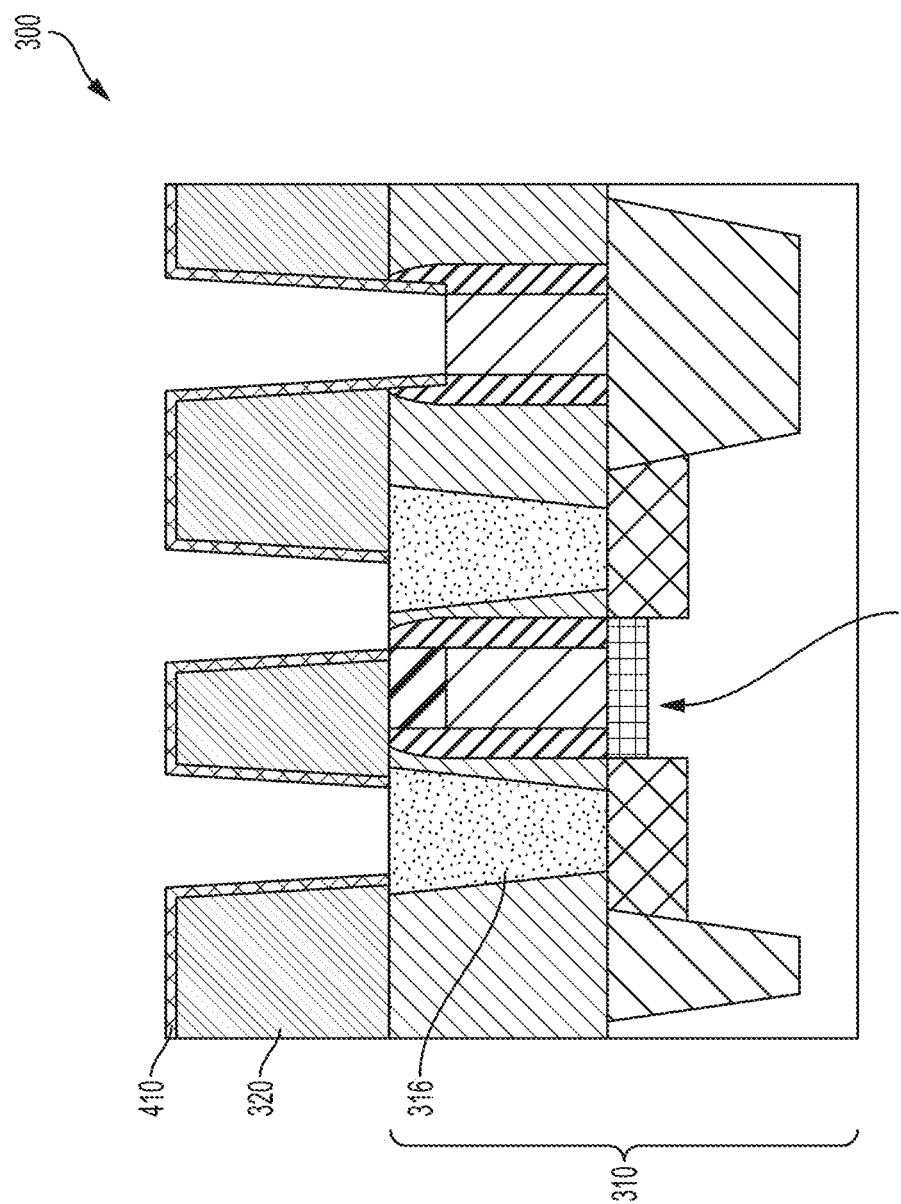

FIG. 12 depicts a cross-sectional view of the structure 300 after removing the cap layer during an intermediate operation of the method of fabricating an interconnect structure according to one or more embodiments of the invention. In FIG. 12 (similar to FIG. 6), the cap layer 510 has been removed and the metal layer can be formed and subsequently planarized.

Figure 13:
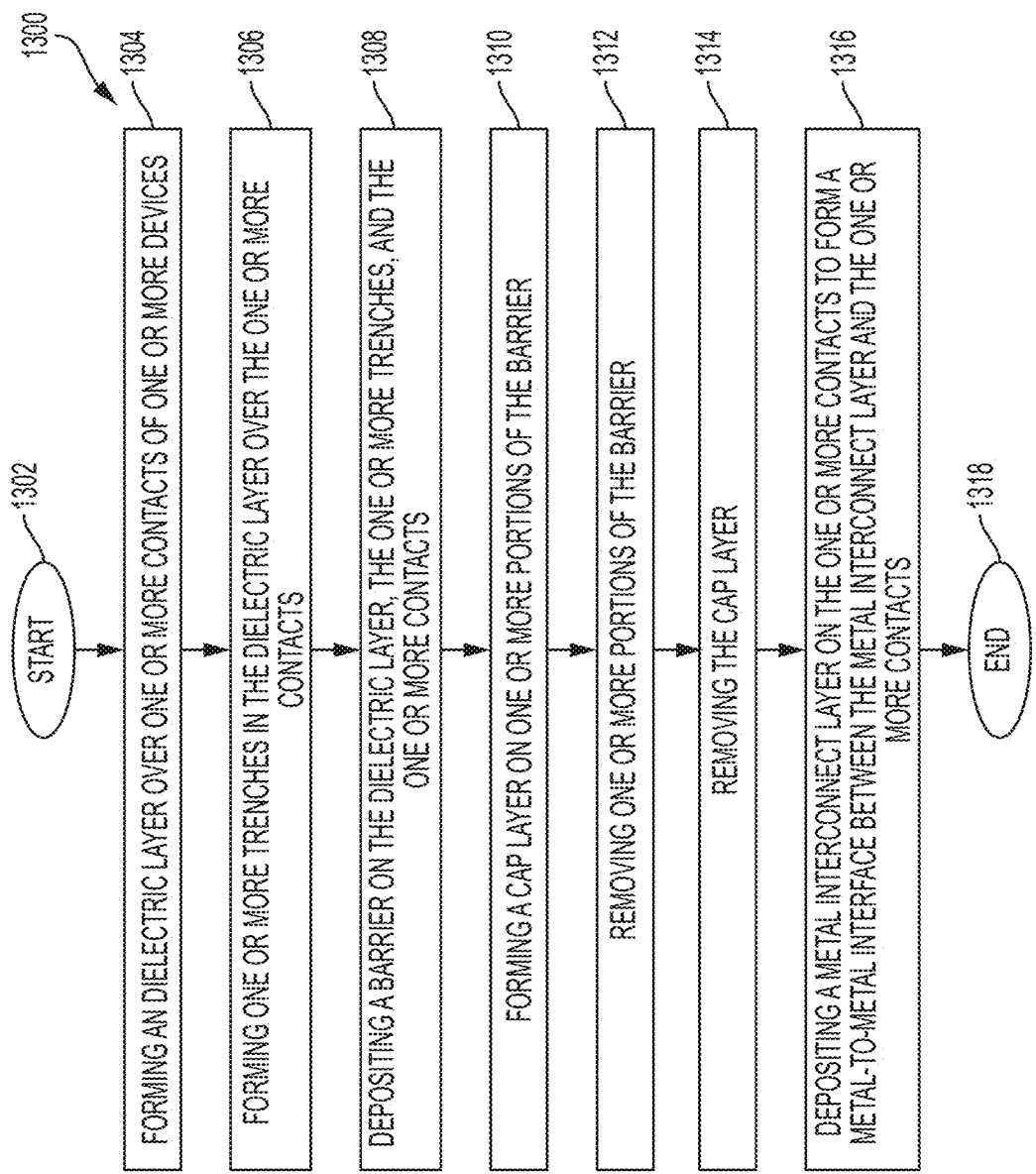
FIG. 13 depicts a flowchart of a method for forming an interconnect structure in accordance with one or more embodiments of the invention.

In FIG. 13, a flowchart of a method 1300 for forming an interconnect structure in accordance with one or more embodiments of the invention is shown. The method 1300 begins at block 1302 and proceeds to block 1304 which provides forming a dielectric layer over one or more contacts of one or more devices. At block 1306, the method 1300 provides for forming one or more trenches in the dielectric layer over the one or more contacts. The method 1300 continues to block 1308 which provides for depositing a barrier on the dielectric layer, the one or more trenches, and the one or more contacts. At block 1310, the method 1300 includes forming a cap layer on one or more portions of the barrier. At block 1312, the method 1300 provides for removing one or more portions of the barrier. The method 1300 at block 1314 provides for removing the cap layer and proceeds to block 1316 which provides for depositing a metal interconnect layer on the one or more contacts to a metal-to-metal interface between the metal interconnect layer and the one or more contacts.

The techniques described herein reduce the resistivity of MOL interconnects which improves the performance of the devices by forming metal-to-metal interfaces between the interconnect layer and the contact of the semiconductor devices. In addition, an improvement in resistivity of semiconductor devices having a misalignment between the metal interconnect and the contacts provide a higher tolerance due to the removal of the barrier layer at the interconnect-contact interface.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an interconnect structure, the method comprising:
    forming a dielectric layer over one or more contacts of one or more devices;
    forming a trench in the dielectric layer over one or more contacts;
    depositing a barrier layer on the dielectric layer, the trench, and the one or more contacts;
    forming a cap layer on one or more portions of the barrier layer, wherein forming the cap layer comprises depositing the cap layer on one or more portions of the barrier layer outside the trench to expose one or more portions of the barrier layer disposed in the trench, wherein a bottom-most portion of the trench and one or more portions of sidewalls of the trench remain exposed while forming the cap layer, wherein forming the cap layer is performed by a plasma vapor deposition (PVD) Si deposition process;
    removing the one or more portions of the barrier layer disposed in the trench;
    removing the cap layer from the one or more portions of the barrier layer outside the trench; and
    depositing a metal interconnect layer directly on the one or more contacts to form a metal-to-metal interface between the metal interconnect layer and the one or more contacts, wherein the metal interconnect layer directly contacts the one or more contacts, wherein depositing the metal interconnect layer is formed in a single metal deposition process.

2. The method of claim 1, wherein removing the one or more portions of the barrier layer is performed by a directional RIE process.

3. The method of claim 1, wherein removing the one or more portions of the barrier layer exposes the one or more contacts.

4. The method of claim 1, wherein one or more portions of the barrier layer remains over the dielectric layer.

5. The method of claim 4, wherein one or more portions of the barrier layer remains on a sidewall of the dielectric layer.

6. The method of claim 1, wherein removing the cap layer is performed by a selective etch process.

7. The method of claim 1, wherein the metal layer comprises at least one of tungsten (W), cobalt (Co), copper (Cu), or ruthenium (Ru).

8. The method of claim 7, wherein the metal layer is cobalt, performing at least one of a plasma vapor deposition process (PVD) or a chemical vapor deposition (CVD).

9. The method of claim 7, wherein the metal layer is copper, and the method further comprises performing a PVD process followed by an electroplating process.

10. A method of fabricating an interconnect structure, the method comprising:
    forming a dielectric layer over one or more contacts of one or more devices; forming a trench in the dielectric layer over one or more contacts;
    depositing a barrier layer on the dielectric layer, the trench, and the one or more contacts;
    forming a cap layer on one or more portions of the barrier layer, wherein forming the cap layer comprises depositing the cap layer on one or more portions of the barrier layer outside the trench to expose one or more portions of the barrier layer disposed in the trench, wherein a bottom-most portion of the trench and one or more portions of sidewalls of the trench remain exposed while forming the cap layer;
    removing the one or more portions of the barrier layer disposed in the trench;
    removing the cap layer from the one or more portions of the barrier layer outside the trench; and
    depositing a metal interconnect layer directly on the one or more contacts to foam metal-to-metal interface between the metal interconnect layer and the one or more contacts, wherein the metal interconnect layer directly contacts the one or more contacts, wherein depositing the metal interconnect layer is formed in a single metal deposition process.

* * * * *